(12) United States Patent  
Kang et al.

(10) Patent No.: US 12,159,826 B2  
(45) Date of Patent: Dec. 3, 2024

(54) SEMICONDUCTOR PACKAGE AND METHOD OF MANUFACTURING THE SEMICONDUCTOR PACKAGE

(71) Applicant: SAMSUNG ELECTRONICS CO., LTD., Suwon-si (KR)

(72) Inventors: Myungsam Kang, Hwaseong-si (KR); Youngchan Ko, Suwon-si (KR); Jeongseok Kim, Suwon-si (KR); Kyungdon Mun, Gyeonggi-do (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 33 days.

(21) Appl. No.: 17/476,670

(22) Filed: Sep. 16, 2021

(65) Prior Publication Data

US 2022/0199520 A1 Jun. 23, 2022

(30) Foreign Application Priority Data

Dec. 18, 2020 (KR) ........................ 10-2020-0178164

(51) Int. Cl.
*H01L 23/522* (2006.01)
*H01L 21/48* (2006.01)
(Continued)

(52) U.S. Cl.
CPC ...... *H01L 23/5223* (2013.01); *H01L 21/4853* (2013.01); *H01L 21/4857* (2013.01);
(Continued)

(58) Field of Classification Search
CPC .............. H01L 21/4857; H01L 21/486; H01L 23/49822; H01L 23/5223; H01L 23/642;
(Continued)

(56) References Cited

U.S. PATENT DOCUMENTS 8,183,466 B2 5/2012 Suzuki et al.
9,420,683 B2 8/2016 Lee et al.
(Continued)

FOREIGN PATENT DOCUMENTS

KR 10-1190920 10/2012
KR 10-1472638 12/2014
(Continued)

*Primary Examiner* — Victor A Mandala
*Assistant Examiner* — Lawrence C Tynes, Jr.
(74) *Attorney, Agent, or Firm* — F. Chau & Associates, LLC

(57) ABSTRACT

A semiconductor package includes a support substrate having connection wirings disposed therein. At least one capacitor is disposed on the support substrate. The capacitor has first and second electrodes that are exposed from an upper surface of the support substrate. A redistribution wiring layer covers the upper surface of the support substrate. The redistribution wiring layer has redistribution wirings electrically connected to the connection wirings and the first and second electrodes respectively. A semiconductor chip is disposed on the redistribution wiring layer. The semiconductor chip has chip pads that are electrically connected to the redistribution wirings and outer connectors disposed on a lower surface of the support substrate and electrically connected to the connection wirings.

16 Claims, 19 Drawing Sheets

(51) Int. Cl.
 *H01L 23/00* (2006.01)
 *H01L 23/498* (2006.01)

(52) U.S. Cl.
 CPC ...... *H01L 21/486* (2013.01); *H01L 23/49816* (2013.01); *H01L 23/49822* (2013.01); *H01L 24/05* (2013.01); *H01L 24/16* (2013.01); *H01L 2224/05569* (2013.01); *H01L 2224/16227* (2013.01)

(58) Field of Classification Search
 CPC .. H01L 2224/16225; H01L 2225/1023; H05K 1/0231; H05K 1/185
 See application file for complete search history.

(56) References Cited

U.S. PATENT DOCUMENTS

| | | | |
|---|---|---|---|
| 9,426,891 B2 | 8/2016 | Tsai et al. | |
| 9,693,461 B2 | 6/2017 | Zhao et al. | |
| 9,999,131 B2 | 6/2018 | Ko et al. | |
| 10,381,302 B2 | 8/2019 | Shih et al. | |
| 2010/0163172 A1* | 7/2010 | Saita | H05K 1/185 156/272.6 |
| 2013/0192884 A1* | 8/2013 | Furutani | H01L 24/19 174/258 |
| 2014/0144676 A1* | 5/2014 | Chung | H05K 1/186 174/251 |
| 2016/0105966 A1* | 4/2016 | Tomikawa | H05K 1/185 174/255 |
| 2017/0076866 A1* | 3/2017 | Okai | H01G 4/0085 |
| 2020/0176417 A1 | 6/2020 | Navaja et al. | |
| 2020/0194381 A1 | 6/2020 | Park | |
| 2021/0343684 A1* | 11/2021 | Kim | H01L 24/13 |

FOREIGN PATENT DOCUMENTS

| | | | |
|---|---|---|---|
| KR | 10-1580472 | 12/2015 | |
| KR | 10-2020-00695 | 6/2020 | |
| WO | WO-2020080993 A1 * | 4/2020 | ............. H01G 11/04 |

* cited by examiner

FIG. 3
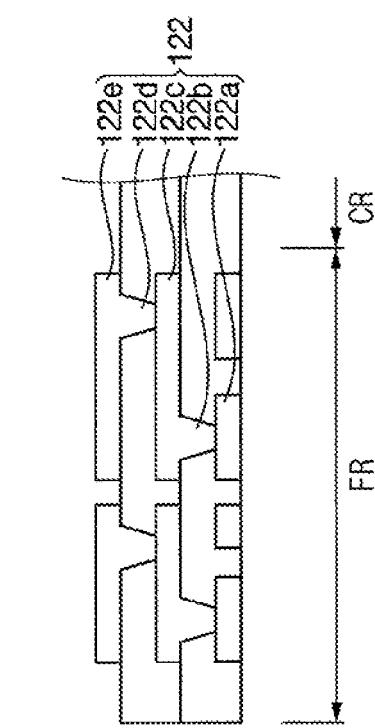
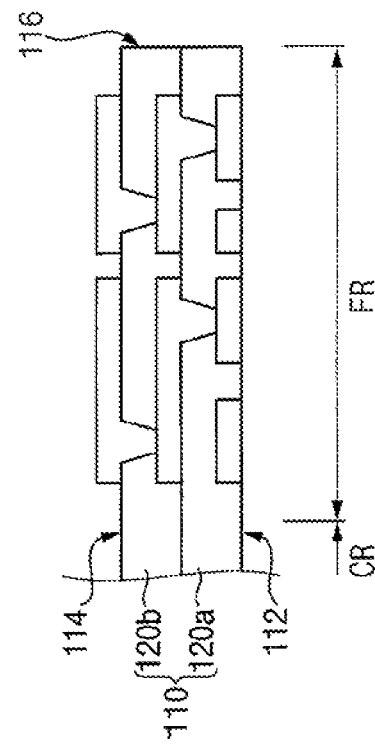

14

SEMICONDUCTOR PACKAGE AND METHOD OF MANUFACTURING THE SEMICONDUCTOR PACKAGE

CROSS-REFERENCE TO RELATED APPLICATION

This application claims priority under 35 U.S.C. § 119 to Korean Patent Application No. 10-2020-0178164, filed on Dec. 18, 2020 in the Korean Intellectual Property Office (KIPO), the contents of which are herein incorporated by reference in their entirety.

TECHNICAL FIELD

The present disclosure relates to semiconductors and, more specifically to a semiconductor package and a method of manufacturing the semiconductor package.

DISCUSSION OF THE RELATED ART

A capacitor mounted as a decoupling capacitor for an application processor in a fan out package may be manufactured in the form of a Land-Side Capacitor (LSC). Since the LSC type capacitor is disposed on an outer surface on which solder balls are disposed, the capacitor may be required to be relatively thin. Accordingly, cracks may occur during surface mounting of the capacitor. Additionally, the capacitance of such capacitors may be limited.

SUMMARY

A semiconductor package includes a support substrate having connection wirings disposed therein and at least one capacitor disposed on the support substrate. The capacitor includes first and second electrodes that are exposed from an upper surface of the support substrate. A redistribution wiring layer covers the upper surface of the support substrate. The redistribution wiring layer has redistribution wirings electrically connected to the connection wirings and the first and second electrodes respectively. A semiconductor chip is disposed on the redistribution wiring layer. The semiconductor chip has chip pads that are electrically connected to the redistribution wirings and outer connectors disposed on a lower surface of the support substrate and electrically connected to the connection wirings.

A semiconductor package includes a support substrate having a cavity penetrating therethrough. At least one capacitor is disposed in the cavity of the support substrate. The capacitor has first and second electrodes that are exposed from an upper surface of the support substrate. A sealing layer fills the cavity and covers a lower surface of the support substrate. A redistribution wiring layer covers the upper surface of the support substrate. The redistribution wiring layer has redistribution wirings electrically connected to the connection wirings of the support substrate and the first and second electrodes respectively. A semiconductor chip is disposed on the redistribution wiring layer. The semiconductor chip has chip pads that are electrically connected to the redistribution wirings respectively, and outer connectors disposed on a lower surface of the sealing layer and electrically connected to the connection wirings respectively.

A semiconductor package includes a hybrid stack substrate including a support substrate having connection wirings and a cavity penetrating through the support substrate. At least one capacitor is disposed in the cavity of the support substrate. The at least one capacitor includes first and second electrodes that are exposed from an upper surface of the support substrate. A redistribution wiring layer covers the upper surface of the support substrate and has redistribution wirings electrically connected to the connection wirings and the first and second electrodes respectively. A semiconductor chip is disposed on the hybrid stack substrate. The semiconductor chip includes chip pads that are electrically connected to the redistribution wirings. Outer connectors on a lower surface of the hybrid stack substrate are electrically connected to the connection wirings.

A semiconductor package includes a package substrate. A hybrid stack substrate is mounted on the package substrate via connectors. A semiconductor chip is mounted on the hybrid stack substrate. The hybrid stack substrate includes a support substrate having connection wirings electrically connected to the connectors respectively. At least one passive element is disposed in the support substrate. A surface of the capacitor is exposed from an upper surface of the support substrate. A redistribution wiring layer covers the upper surface of the support substrate and has redistribution wirings electrically connected to the connection wirings and the passive element respectively.

A semiconductor package may include a hybrid stack substrate having a support substrate with at least one capacitor embedded therein and a redistribution wiring layer stacked on the support substrate and having redistribution wirings electrically connected to first and second electrodes of the capacitor and connection wirings of the support substrate respectively. At least one semiconductor chip is mounted on the hybrid stack substrate. Outer connectors are disposed on a lower surface of the hybrid stack substrate.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein:

FIGS. 3 to 13 are cross-sectional views illustrating a method of manufacturing a semiconductor package in accordance with example embodiments of the present disclosure;

DETAILED DESCRIPTION OF THE DRAWINGS

Hereinafter, example embodiments of the present disclosure will be explained in detail with reference to the accompanying drawings.

Figure 1:
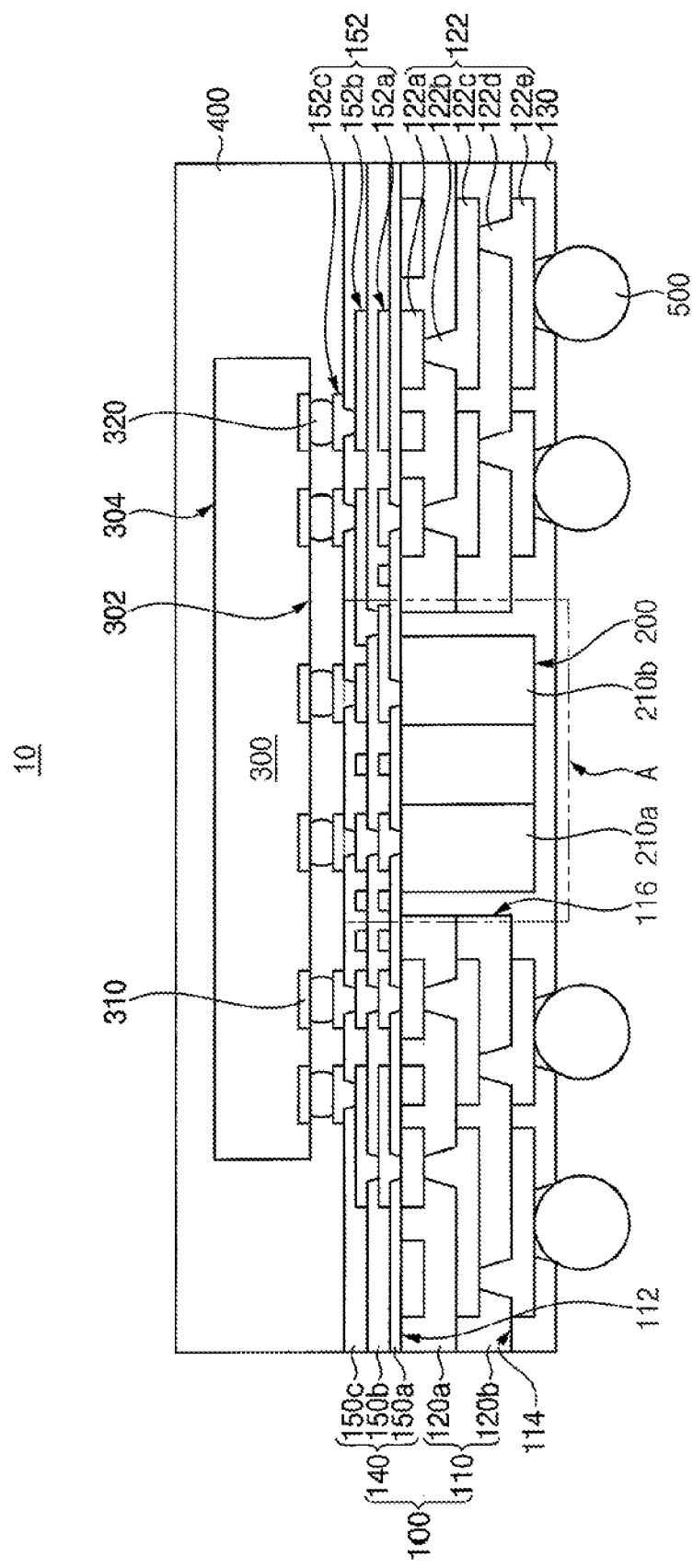
FIG. 1 is a cross-sectional view illustrating a semiconductor package in accordance with example embodiments of the present disclosure.
Figure 2:
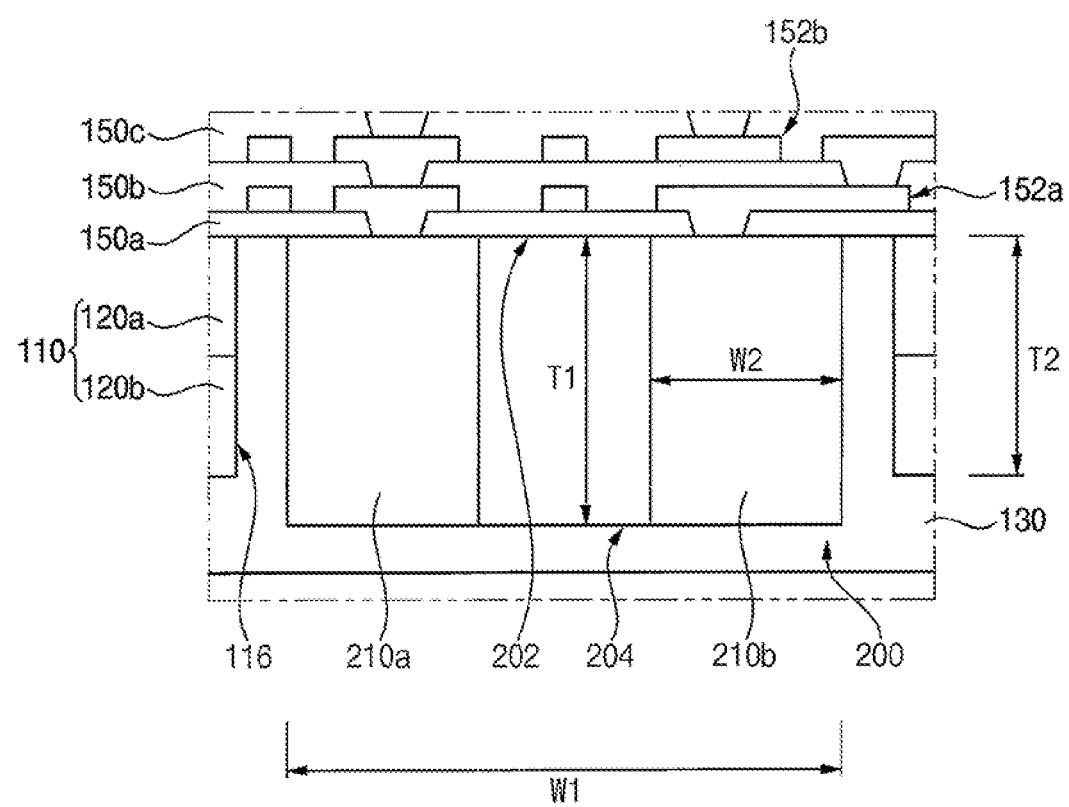
FIG. 2 is an enlarged cross-sectional view illustrating portion 'A' in FIG. 1.

FIG. 1 is a cross-sectional view illustrating a semiconductor package in accordance with example embodiments of the present disclosure. FIG. 2 is an enlarged cross-sectional view illustrating portion 'A' in FIG. 1.

Referring to FIGS. 1 and 2, a semiconductor package 10 may include a hybrid stack substrate 100, at least one semiconductor chip 300 mounted on the hybrid stack substrate 100, and outer connectors 500 disposed on an outer surface of the hybrid stack substrate 100. The semiconductor package 10 may further include a molding 400 disposed on the hybrid stack substrate 100 and covering the semiconductor chip 300. The hybrid stack substrate 100 may include a support substrate 110 as a core substrate and a redistribution wiring layer 140 stacked on the support substrate 110.

In example embodiments of the present disclosure, the semiconductor package 10 may include the hybrid stack substrate 100 provided as a base substrate that supports the semiconductor chip 300. The hybrid stack substrate 100 may include connection wirings 120 that are disposed on a fan out region outside an area where the semiconductor chip 300 serves as an electrical connection path with the semiconductor chip 300, and redistribution wirings. Accordingly, the semiconductor package 10 may be provided as a fan-out package. The semiconductor package 10 may be provided as a unit package on which a second package is stacked.

Further, the semiconductor package 10 may be provided as a System-In-Package (SIP). For example, the semiconductor chip may include a logic chip including logic circuits and/or a memory chip. The logic chip may be a controller that controls the memory chip. The memory chip may include various memory circuits such as dynamic random access memory (DRAM), static random access memory (SRAM), flash, phase-change random access memory (PRAM), resistive random access memory (ReRAM), ferroelectric random access memory (FeRAM), magnetic random access memory (MRAM), or the like.

In example embodiments of the present disclosure, the hybrid stack substrate 100 may include a support substrate 110 having a passive element such as a capacitor 200 disposed thereon. A redistribution wiring layer 140 may be stacked on the support substrate 110.

For example, the support substrate 110 may have a first surface (upper surface) 112 and a second surface (lower surface) 114 that are opposite to each other. The support substrate 110 may have a cavity 116 in the middle region thereof. The cavity 116 may extend from the first surface 112 to the second surface 114 of the support substrate 110.

The support substrate 110 may be a coreless substrate formed by an embedded trace substrate (ETS) method. In this case, the support substrate 110 may include a plurality of insulation layers and circuit layers in the insulation layers. Alternatively, the support substrate may be a core multilayered substrate. In this case, the core multilayered substrate may include a core layer and circuit layers stacked on both upper and lower surfaces of the core layer.

As illustrated in FIG. 1, the support substrate 110 may include a plurality of stacked insulation layers 120a and 120b and connection wirings 122 provided as electrical conductors in the insulation layers. A plurality of the connection wirings 122 may penetrate through the support substrate 110 from the first surface 112 to the second surface 114 of the support substrate 110 to function as an electrical connection path.

For example, the support substrate 110 may include a first insulation layer 120a and a second insulation layer 120b stacked on the first insulation layer 120a. The connection wiring 122 may include a first metal wiring 122a, a first contact 122b, a second metal wiring 122c, a second contact 122d, and a third metal wiring 122e. The first metal wiring 122a may be disposed on the first surface 112 of the support substrate 110 (e.g., in a lower surface of the first insulation layer 120a), and at least a portion of the first metal wiring 122a may be exposed from the first surface 112. The third metal wiring 122e may be disposed on the second surface 114 of the support substrate 110 (e.g., in an upper surface of the second insulation layer 120b), and at least a portion of the third metal wiring 122e may be exposed from the second surface 114. As used herein, the phrase "A is exposed from B" may mean that B covers A incompletely with various portions of A being exposed to one or more other layers by one or more openings within B. It may be understood that the numbers and arrangements of the insulation layers and the core connection wirings of the core substrate 100 might not be limited thereto.

In example embodiments of the present disclosure, the capacitor 200 may be disposed within the cavity 116 of the support substrate 110. A sidewall of the capacitor 200 may be spaced apart from an inner sidewall of the cavity 116. Accordingly, a gap may be formed between the sidewall of the capacitor 200 and the inner sidewall of the cavity 116. For example, the support substrate 110 may have several to several ten of cavities 116, and one capacitor 200 may be disposed in each of the cavities 116. Alternatively, a plurality of capacitors 200 may be disposed within one cavity 116.

As illustrated in FIG. 2, the capacitor 200 may have first and second electrodes 210a and 210b. An upper surface 202 of the capacitor 200 is exposed from the upper surface 112 of the support substrate 110. A lower surface 204 of the capacitor 200 is exposed from the lower surface 114 of the support substrate 110. Surfaces of the first and second electrodes 210a and 210b disposed on the upper surface 202 of the capacitor 200 may be coplanar with the upper surface 112 of the support substrate 110.

The capacitor 200 may serve as a decoupling capacitor for stabilizing voltages of the semiconductor chip 300. The capacitor 200 may include a multilayer ceramic capacitor (MLCC), a silicon capacitor, etc. The capacitor 200 may have a capacitance of several hundred nF. Examples of the multilayer ceramic capacitor may be a vertically stacked three-terminal type low inductance chip capacitor (LICC), a multi-terminal type low-ESL MLCC, an MLCC having a structure in which the electrode is only underneath, etc.

For example, a thickness T1 of the capacitor 200 may be greater than or equal to the thickness T2 of the support substrate 110. Accordingly, the second surface 204 opposite to the first surface 202 of the capacitor 200 may be coplanar with or positioned higher than the second surface 114 of the support substrate 110. The thickness T1 of the capacitor 200 may be within a range of from 50 μm to 250 μm. A width W1 of the capacitor 200 may be within a range of from 450 μm to 900 μm. Widths of the first and second electrodes 210a and 210b of the capacitor 200 may be within a range of from 150 μm to 300 μm.

In example embodiments of the present disclosure, the hybrid stack substrate 100 may further include a sealing layer 130 that is disposed on the second surface 114 of the support substrate 110 and covers the capacitor 200. The sealing layer 130 may fill the gap between the sidewall of the capacitor 200 and the inner sidewall of the cavity 116. Accordingly, the sealing layer 130 may cover the second surface 204 of the capacitor 200, the second surface 114 of the support substrate 110, and the inner sidewall of the cavity 116.

For example, the sealing layer 130 may include a thermosetting resin such as epoxy resin, a thermoplastic resin such as polyimide, a resin including reinforcing materials such as inorganic fillers, etc. For example, the sealing layer may include an insulation film such as ABF (Ajinomoto Build-up Film), a composite material such as FR-4, a resin such as BT (Bismaleimide Triazine), etc. The sealing layer may include a molding material such as Epoxy Molding Compound (EMC), a photosensitive insulating material such as PIE (Photo Imagable Encapsulant), etc.

In example embodiments of the present disclosure, the redistribution wiring layer 140 may be disposed on the first surface 112 of the support substrate 110 and the first surface 202 of the capacitor 200. The redistribution wiring layer 140 may include redistribution wirings 152 electrically connected to the first and second electrodes 210a and 210b of the capacitor 200 and the connection wirings 122, respectively.

For example, the redistribution wiring layer 140 may include a first lower insulation layer 150a disposed on the upper surface 112 of the support substrate 110 and having first openings that expose the first and second electrodes 210a and 210b of the capacitor 200 and the first metal wirings 122a of the connection wirings 122 respectively, and first redistribution wirings 152a disposed on the first lower insulation layer and electrically connected to the first and second electrodes 210a and 210b and the first metal wiring 122a through the first openings respectively.

The redistribution wiring layer 140 may include a second lower insulation layer 150b disposed on the first lower insulation layer 150a and having second openings that expose the first redistribution wirings 152a, and second redistribution wirings 152b electrically connected to the first redistribution wirings 152a through the second openings respectively.

The redistribution wiring layer 140 may include a third lower insulation layer 150c disposed on the second lower insulation layer 150b and having third openings that expose the second redistribution wirings 152b, and third redistribution wirings 152c electrically connected to the second redistribution wirings 152b through the third openings respectively.

The redistribution wiring layer 140 may include a protective pattern disposed on the third lower insulation layer 150c to expose at least portions of the third redistribution wirings 152c. In this case, a bump pad such as UBM (Under Bump Metallurgy) may be formed on the portion of the third redistribution wiring 152c exposed by the protective pattern. The portion of the third redistribution wirings 152c on which the bump pad is formed may serve as a bonding pad.

For example, the first to third lower insulation layers may include a polymer layer, a dielectric layer, etc. The first to third lower insulation layers may include a photosensitive insulating material (PID), an insulating film such as ABF, etc. The first to third redistribution wirings may include aluminum (Al), copper (Cu), tin (Sn), nickel (Ni), gold (Au), platinum (Pt) or an alloy of at least one of the aforementioned metals.

Accordingly, the hybrid stack substrate 100 may include the support substrate 110 having the passive element such as the capacitor 200 embedded therein and the redistribution wiring layer 140 stacked on the support substrate 100 and having the redistribution wirings 152 electrically connected to the first and second electrodes 210a and 210b of the capacitor 200 respectively, to serve as a high-density interposer.

In example embodiments of the present disclosure, the semiconductor chip 300 may be mounted on the redistribution wiring layer 140 of the hybrid stack substrate 100. The semiconductor chip 300 may be mounted on the redistribution wiring layer 140 in a flip chip boding manner. In this case, the semiconductor chip 300 may be mounted on the redistribution wiring layer 140 such that chip pads 310 of the semiconductor chip 300 face the redistribution wiring layer 140. The chip pads 310 of the semiconductor chip 300 may be electrically connected to the bonding pads, e.g., the third redistribution wirings 152c of the redistribution wiring layer 140 by conductive bumps 320 as conductive connectors. For example, the conductive bumps 320 may include micro bumps (uBumps).

The molding 400 may be disposed on the redistribution wiring layer 140 and may cover the semiconductor chip 300. For example, the molding 400 may include epoxy mold compound (EMC).

In example embodiments of the present disclosure, the outer connectors 500 may be disposed on a lower surface of the sealing layer 130 on the lower surface 114 of the support substrate 110 and may be electrically connected to the connection wirings 122 respectively.

The third metal wirings 122e of the connection wiring 122 may be exposed by openings formed in the sealing layer 130. A bump pad such as UBM may be formed on the portion of the third metal wirings 122e exposed by the opening. The outer connectors 500 may be mounted on an outer surface of the sealing layer 130. The outer connectors 500 may be disposed on the bump pads on the third metal wirings 122e respectively. The outer connectors 500 may be electrically connected to the connection wirings 122 through the openings formed in the sealing layer 130, respectively. For example, the outer connectors 500 may include solder balls. The solder ball may have a diameter within a range of 300 µm to 500 µm.

The semiconductor package 10 may be mounted on a module substrate via the solder balls to constitute a memory module.

As mentioned above, the semiconductor package 10 may include the hybrid stack substrate 100 having the support substrate 110 with the at least one capacitor 200 embedded therein and the redistribution wiring layer 140 stacked on the support substrate 110 and having the redistribution wirings 152 electrically connected to the first and second electrodes 210a, 210b of the capacitor 200 and the connection wirings 122 of the support substrate 110 respectively, the at least one semiconductor chip 300 mounted on the hybrid stack substrate 100, and the outer connectors 500 disposed on the outer surface of the hybrid stack substrate 100.

Accordingly, since the capacitor 200 is disposed in the cavity 116 of the support substrate 110, the capacitor 200 may have a thickness that is greater than a thickness of a conventional Land-Side Capacitor (LSC) type capacitor. Thus, defects that may occur during surface mounting of the capacitor 200 may be reduced or prevented. Further, the capacitance can be increased without using an integrated passive device (IPD) or an ultra-thin capacitor, to thereby reduce the cost for the capacitor.

Furthermore, since the capacitor 200 is disposed at a desired position in the support substrate 110, a connection path with the semiconductor chip 300 may be reduced to enhance electrical performances such as loop inductance.

Hereinafter, a method of manufacturing the semiconductor package in FIG. 1 will be explained.

FIGS. 3 to 13 are cross-sectional views illustrating a method of manufacturing a semiconductor package in accordance with example embodiments of the present disclosure.

Figure 4:
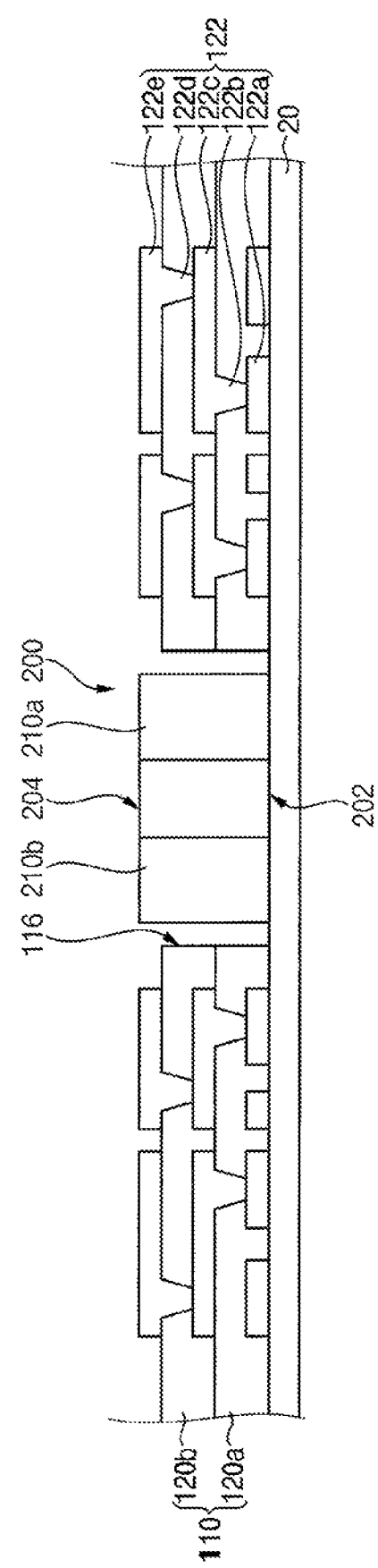
Figure 5:
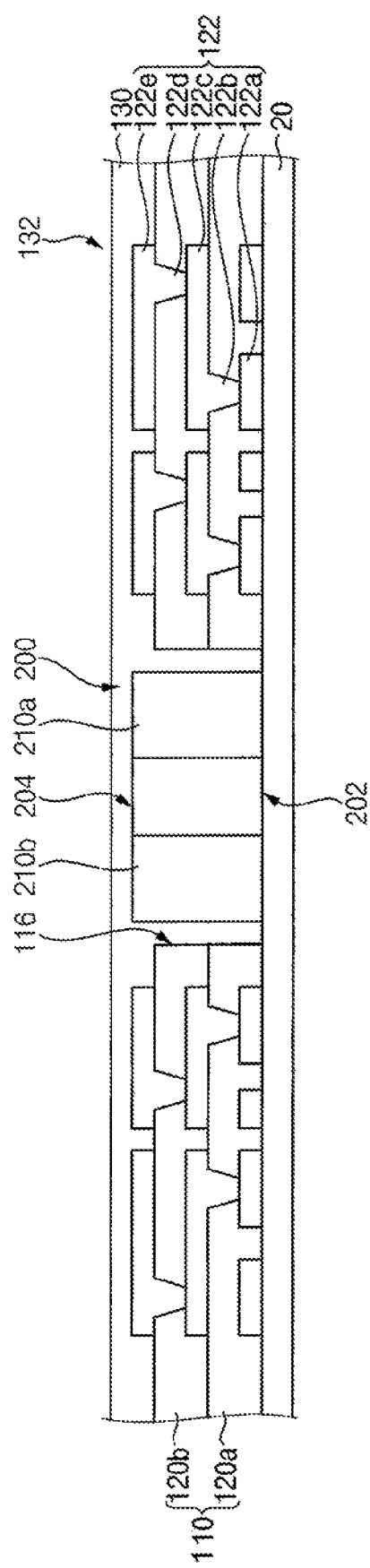

Referring to FIGS. 3 to 5, a panel having a plurality of support substrates 110 formed therein may be prepared, at least one capacitor 200 may be disposed within a cavity 116 of the support substrate 110, and then, a sealing layer 130 may cover the capacitor 200.

In example embodiments of the present disclosure, the support substrate 110 may be used as a support frame for electrical connection for manufacturing a semiconductor package having a fan-out panel level package configuration.

For example, the panel may include a frame region FR on which the support substrate 110 is formed and a scribe lane region (e.g., a cutting region CA) at least partially surrounding the frame region FR. As described later, the panel may be sawed along the cutting region CA dividing the frame regions FR to form an individual support substrate 110.

The support substrate 110 may have a first surface 112 and a second surface 114 opposite to each other. The support substrate 110 may have the cavity 116 in a middle region of the frame region FR. As described later, the cavity 116 may have an area for receiving at least one capacitor.

The support substrate 110 may be a coreless substrate formed by an embedded trace substrate (ETS) method. In this case, the support substrate 110 may include a plurality of insulation layers and circuit layers in the insulation layers. Alternatively, the support substrate may be a core multilayered substrate. In this case, the core multilayered substrate may include a core layer and circuit layers stacked on both upper and lower surfaces of the core layer.

As illustrated in FIG. 3, the support substrate 110 may include a plurality of stacked insulation layers 120a and 120b and connection wirings 122 provided as electrical conductors in the insulation layers. A plurality of the connection wirings 122 may penetrate through the support substrate 110 from the first surface 112 to the second surface 114 of the support substrate 110 to function as an electrical connection path.

For example, the support substrate 110 may include a first insulation layer 120a and a second insulation layer 120b stacked on the first insulation layer 120a. The connection wiring 122 may include a first metal wiring 122a, a first contact 122b, a second metal wiring 122c, a second contact 122d, and a third metal wiring 122e. The first metal wiring 122a may be disposed on the first surface 112 of the support substrate 110 (e.g., in a lower surface of the first insulation layer 120a), and at least a portion of the first metal wiring 122a may be exposed from the first surface 112. The third metal wiring 122e may be disposed on the second surface 114 of the support substrate 110 (e.g., in an upper surface of the second insulation layer 120b), and at least a portion of the third metal wiring 122e may be exposed from the second surface 114. It may be understood that the numbers and arrangements of the insulation layers and the core connection wirings of the support substrate 110 might not be limited thereto.

As illustrated in FIG. 4, the panel may be disposed on a barrier tape (or alternatively, a carrier tape) 20, and the at least one capacitor 200 may be disposed within the cavity 116 of the support substrate 110.

The first surface 112 of the support substrate 110 may be adhered on the barrier tape 20. For example, the support substrate 110 may have several to several ten of cavities 116, and one capacitor 200 may be disposed in each of the cavities 116. As described later, a singulation or sawing process may be performed to saw the panel to complete a fan-out panel level package. In some example embodiments of the present disclosure, a plurality of capacitors 200 may be disposed within one cavity 116.

The capacitor 200 may have first and second electrodes 210a and 210b. A first surface 202 of the capacitor 200 may face the barrier tape 20. Surfaces of the first and second electrodes 210a and 210b provided in the first surface 202 of the capacitor 200 may be coplanar with the first surface 112 of the support substrate 110.

The capacitor 200 may be disposed within the cavity 116 of the support substrate 110. A sidewall of the capacitor 200 may be spaced apart from an inner sidewall of the cavity 116. Accordingly, a gap may be formed between the sidewall of the capacitor 200 and the inner sidewall of the cavity 116.

For example, a thickness of the capacitor 200 may be greater than or equal to a thickness of the support substrate 110. Accordingly, a second surface 204 opposite to the first surface 202 of the capacitor 200 may be coplanar with or positioned higher than the second surface 114 of the support substrate 110. The capacitor 200 may include a multilayer ceramic capacitor (MLCC), a silicon capacitor, or the like. The thickness of the capacitor 200 may be within a range of from 50 μm to 250 μm. A width of the capacitor 200 may be within a range of from 450 μm to 900 μm. Widths of the first and second electrodes 210a and 210b of the capacitor 200 may be within a range of from 150 μm to 300 μm.

As illustrated in FIG. 5, the sealing layer 130 may be formed on the second surface 114 of the support substrate 110 and may cover the capacitor 200. The sealing layer 130 may at least partially fill the gap between the sidewall of the capacitor 200 and the inner sidewall of the cavity 116. Accordingly, the sealing layer 130 may cover the second surface 204 of the capacitor 200, the second surface 114 of the support substrate 110 and the inner sidewall of the cavity 116.

For example, the sealing layer 130 may include a thermosetting resin such as epoxy resin, a thermoplastic resin such as polyimide, a resin including reinforcing materials such as inorganic fillers, etc. For example, the sealing layer may include an insulation film such as ABF (Ajinomoto Build-up Film), a composite material such as FR-4, a resin such as BT (Bismaleimide Triazine), etc. The sealing layer may include a molding material such as Epoxy Molding Compound (EMC), a photosensitive insulating material such as PIE (Photo Imagable Encapsulant), etc.

Referring to FIGS. 6 to 9, a redistribution wiring layer 140 may be formed on the first surface 112 of the support substrate 110 and the first surface 202 of the capacitor 200. The redistribution wiring layer 140 may include redistribution wirings 152 electrically connected to the first and second electrodes 210a and 210b of the capacitor 200 and the connection wirings 122, respectively. The redistribution wiring layer 140 may be a front redistribution wiring layer of a fan out package.

Figure 6:
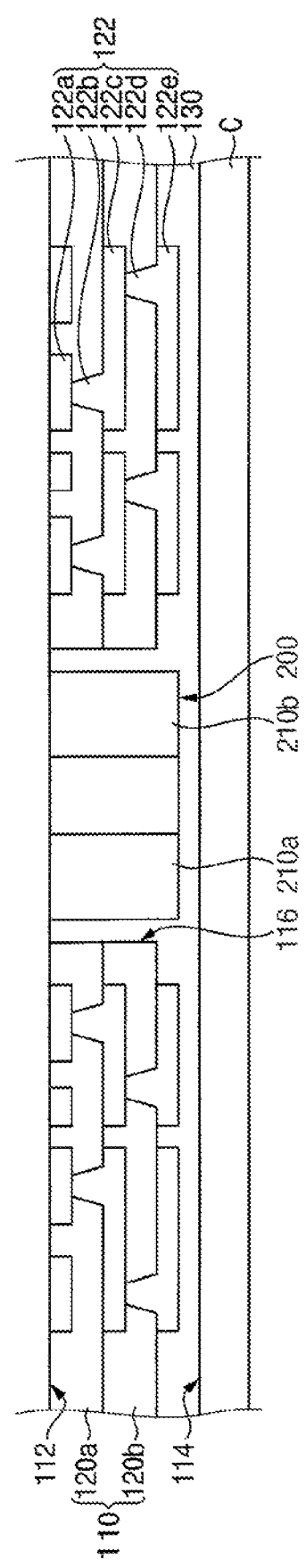
Figure 7:
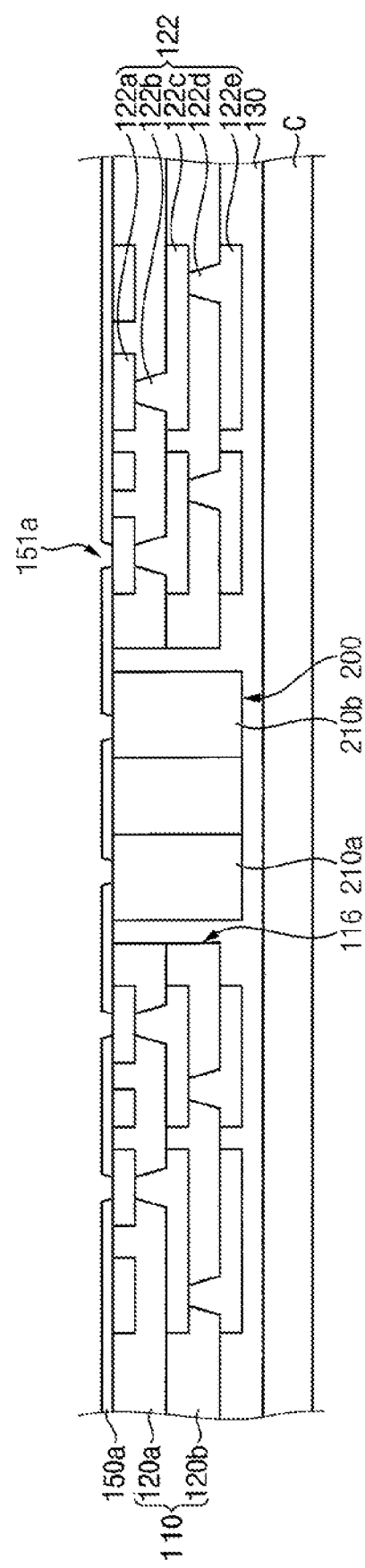

As illustrated in FIGS. 6 and 7, after removing the barrier tape 20, the structure in FIG. 5 may be reversed, and the sealing layer 130 may be adhered on a carrier substrate C. Then, a first lower insulation layer 150a may cover the first surface 112 of the support substrate 110 and the front surface 202 of the capacitor 200, and then, the first lower insulation layer 150a may be patterned to form first openings 151a that expose the first and second electrodes 210a and 210b of the capacitor 200 and the first metal wirings 122a of the core connection wirings 120 respectively.

For example, the first lower insulation layer 150a may include a polymer layer, a dielectric layer, etc. The first lower insulation layer 150a may include PD, the insulation film such as ABF, etc. The first lower insulation layer 150a may be formed by a vapor deposition process, a spin coating process, etc.

Figure 8:
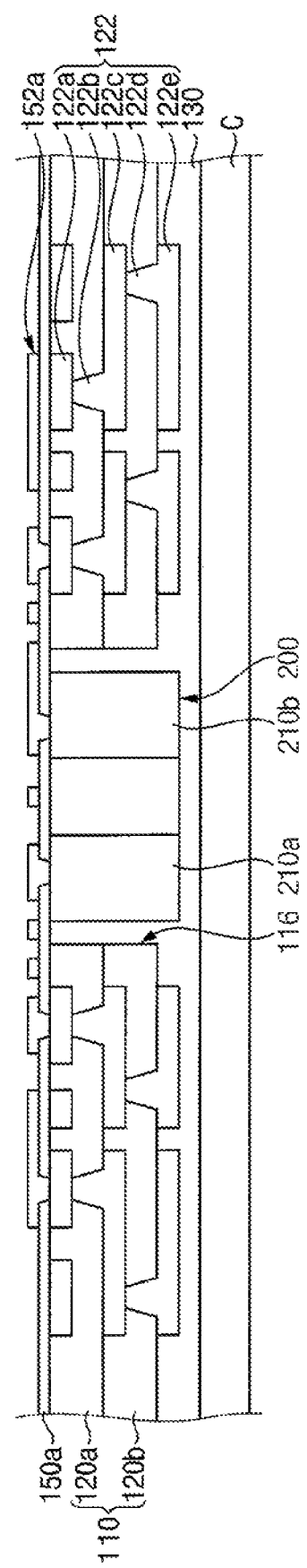

As illustrated in FIG. 8, first redistribution wirings 152a may be formed on the first lower insulation layer 150a. The first redistribution wirings 152a may contact the first and second electrodes 210a, 210b and the first metal wiring 122a through the first openings, respectively. The first redistribution wiring 152a may be formed by forming a seed layer on a portion of the first lower insulation layer 150a and in the first opening, patterning the seed layer and performing an electro plating process. Accordingly, at least portions of the first redistribution wirings 152a may contact the first and second electrodes 210a, 210b and the first metal wirings 122 through the first openings.

For example, the seed layer may be formed by a sputtering process. The seed layer may include an alloy layer including titanium/copper (Ti/Cu), titanium/palladium (Ti/Pd), titanium/nickel (Ti/Ni), chromium/copper (Cr/Cu), or a combination thereof. The first redistribution wiring may include aluminum (Al), copper (Cu), tin (Sn), nickel (Ni), gold (Au), platinum (Pt) or an alloy thereof.

Figure 9:
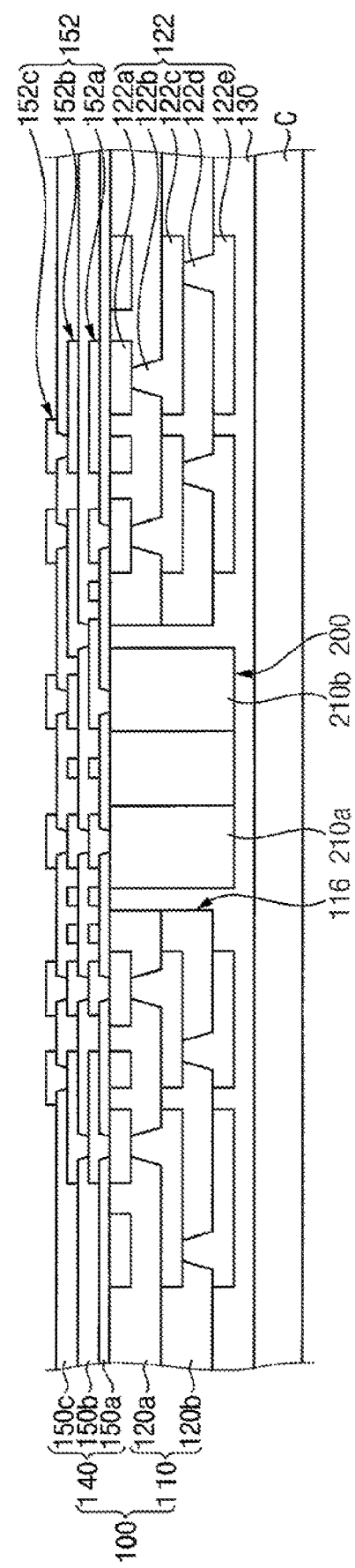

As illustrated in FIG. 9, a second lower insulation layer 150b may be formed on the first lower insulation layer 150a, and then, the second lower insulation layer 150b may be patterned to form second openings that expose the first redistribution wirings 152a respectively. Then, second lower redistribution wirings 152b may be formed on the second lower insulation layer 150b. The second redistribution wirings 152b may contact the first redistribution wirings 152a through the second openings, respectively.

Similarly, a third lower insulation layer 150c may be formed on the second lower insulation layer 150b, and then, the third lower insulation layer 150c may be patterned to form third openings that expose the second redistribution wirings 152b, respectively. Then, third redistribution wirings 152c may be formed on the third lower insulation layer 150c. The third redistribution wirings 152c may contact the second redistribution wirings 152b through the third openings, respectively.

Then, a protective pattern may be formed on the third lower insulation layer 150c to expose at least portions of the third redistribution wirings 152c. In this case, a bump pad such as UBM (Under Bump Metallurgy) may be formed on the portion of the third redistribution wiring 152c exposed by the protective pattern. The portion of the third redistribution wirings 152c on which the bump pad is formed may serve as a bonding pad.

Accordingly, the redistribution wiring layer 140 may be provided on the first surface 112 of the support substrate 110 and may include the redistribution wirings 152 electrically connected to the first and second electrodes 210a, 210b and the connection wirings 122 respectively. It may be understood that the number, sizes, arrangements, etc. of the lower insulation layers and the redistribution wirings of the redistribution wiring layer are exemplarily illustrated, and thus, the present invention is not necessarily limited thereto.

Thus, a hybrid stack substrate 100 including the support substrate 110 having a passive element such as the capacitor 200 and the redistribution wiring layer 140 stacked on the support substrate 100 and having the redistribution wirings 152 electrically connected to the first and second electrodes 210a and 210b of the capacitor 200 respectively may be formed.

Figure 10:
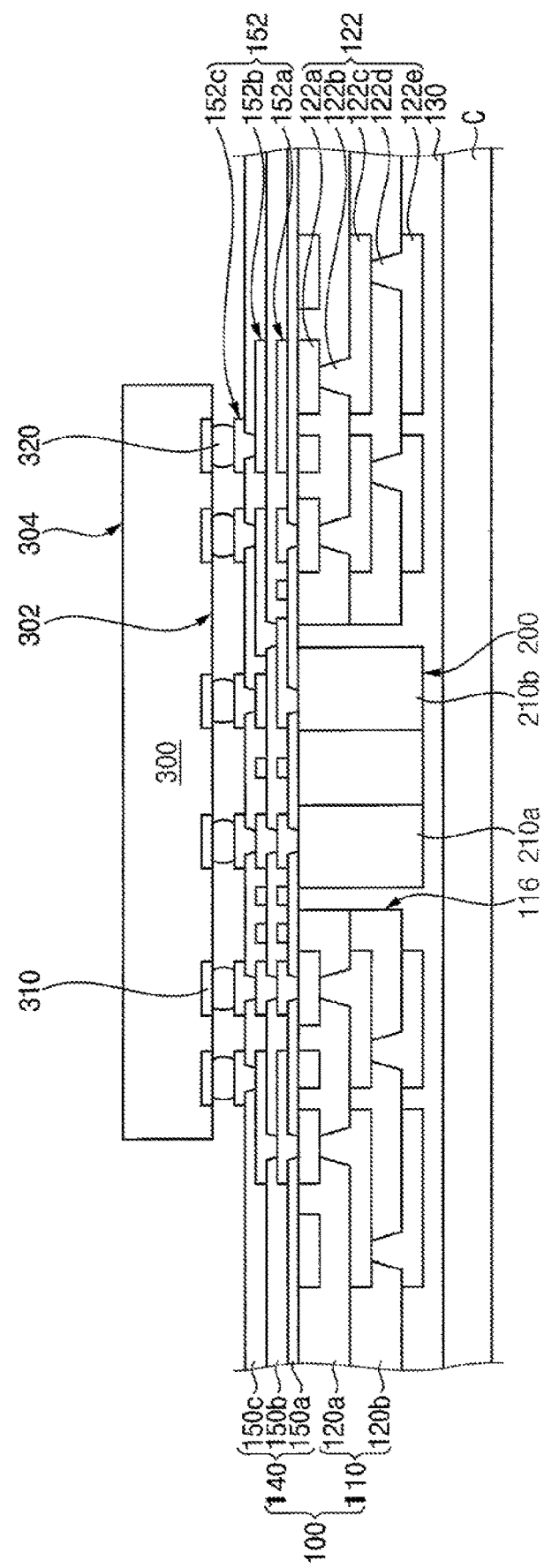
Figure 11:
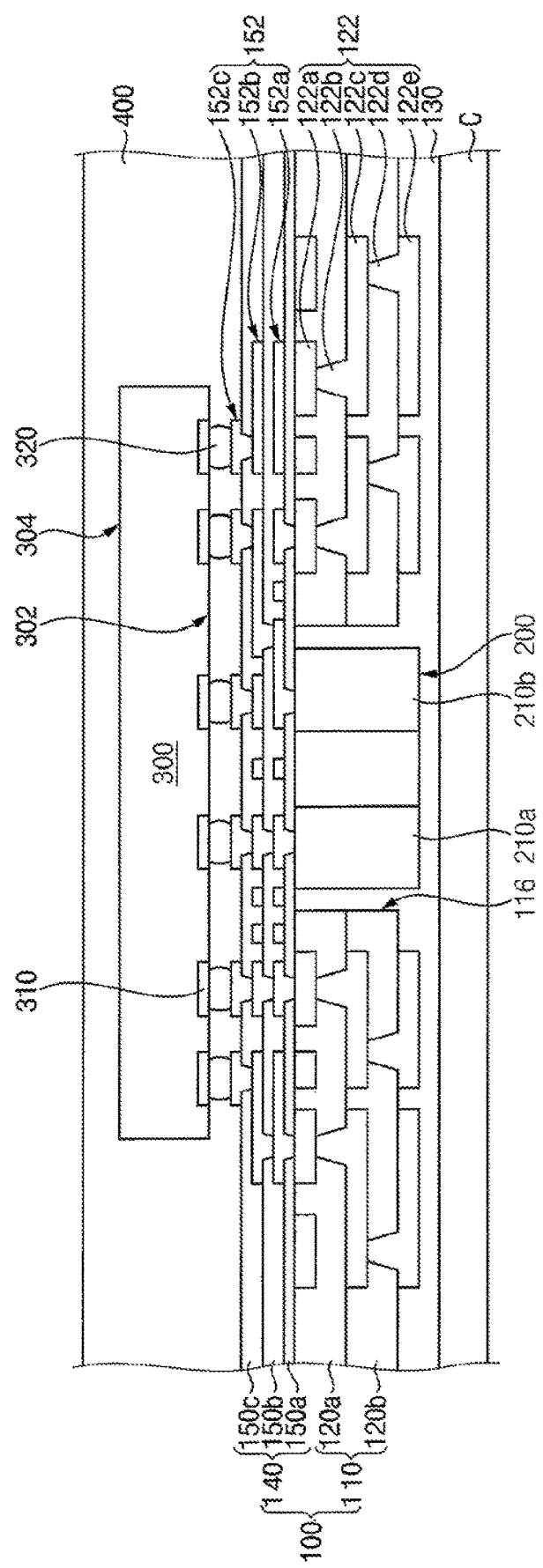

Referring to FIGS. 10 and 11, a semiconductor chip 300 may be mounted on the redistribution wiring layer 140, and a molding 400 may be formed on the redistribution wiring layer 140 and may cover the semiconductor chip 300.

As illustrated in FIG. 10, the semiconductor chip 300 may be mounted on the redistribution wiring layer 140 in a flip chip boding manner. The semiconductor chip 300 may include a substrate and chip pads 310 disposed on a front surface 302, e.g., active surface of the substrate. The chip pads 310 of the semiconductor chip 300 may face the redistribution wiring layer 140. The chip pads 310 of the semiconductor chip 300 may be electrically connected to the bonding pads, e.g., the third redistribution wirings 152c of the redistribution wiring layer 140 by conductive bumps 320. For example, the conductive bumps 320 may include micro bumps (uBumps).

As illustrated in FIG. 11, the molding 400 may be formed on the redistribution wiring layer 140 and may cover the semiconductor chip 300. For example, the molding 400 may include epoxy mold compound (EMC).

Figure 12:
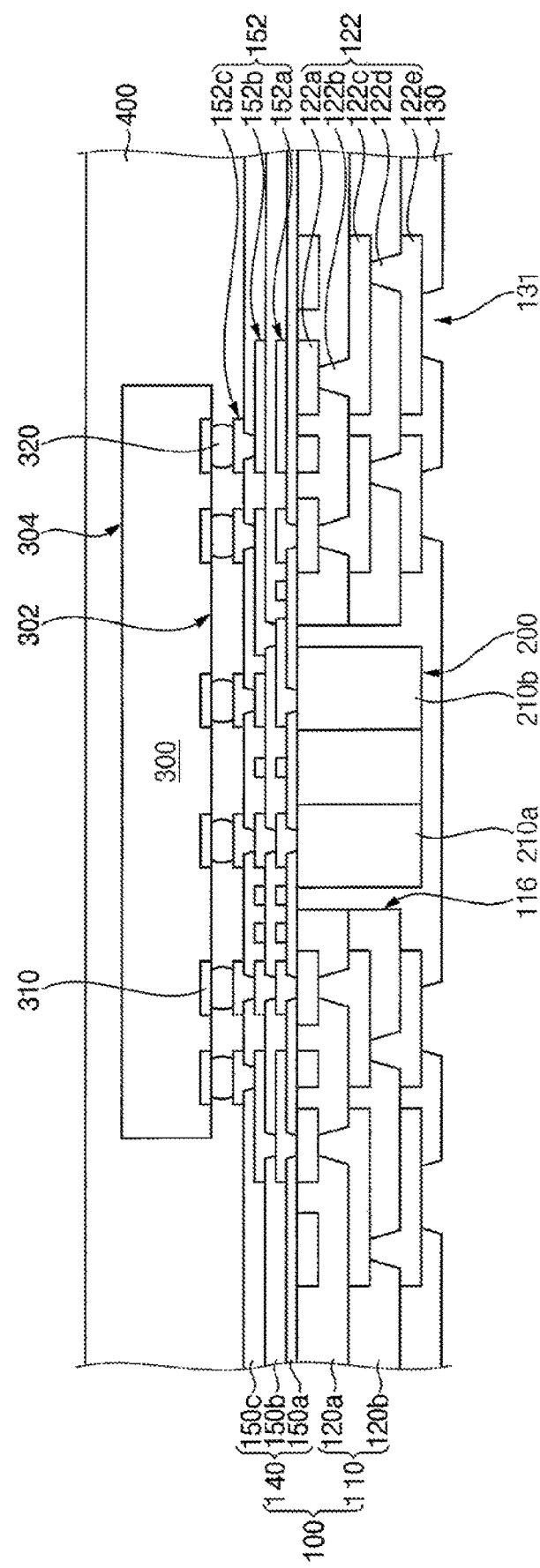
Figure 13:
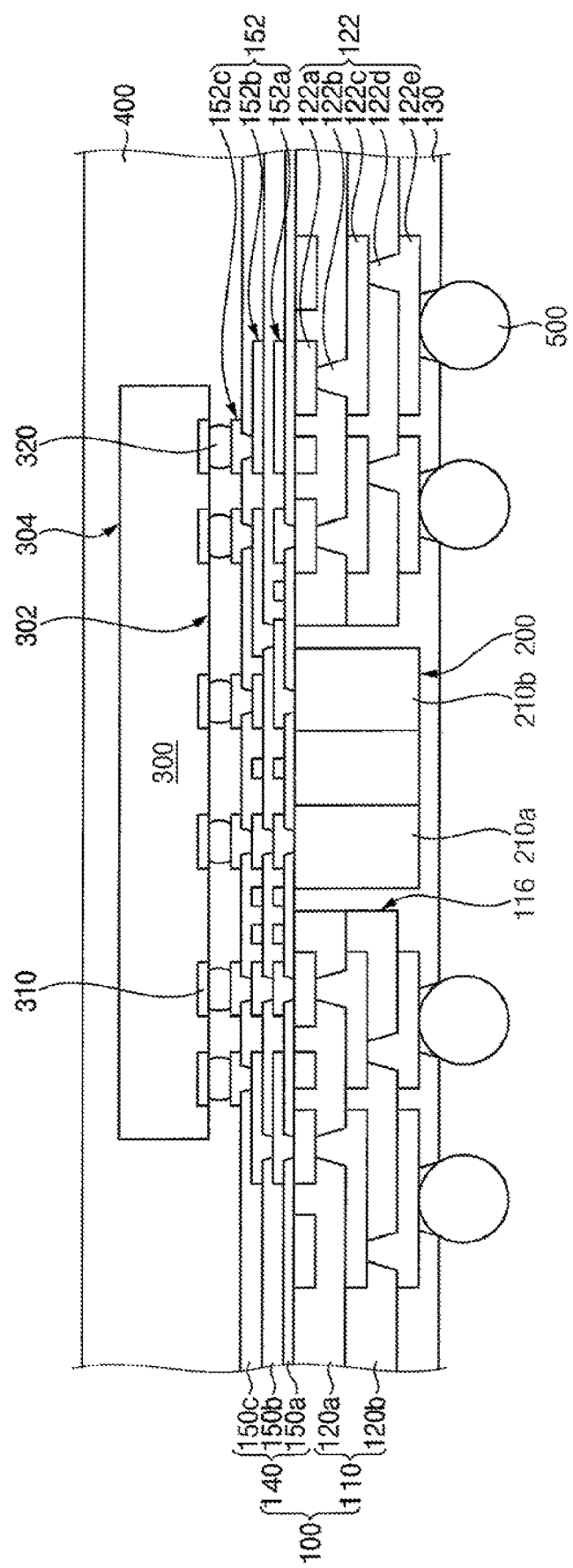

Referring to FIGS. 12 and 13, outer connectors 500 may be disposed on a lower surface of the sealing layer 130 and may be electrically connected to the connection wirings 122, respectively.

As illustrated in FIG. 12, after removing the carrier substrate C, the sealing layer 130 on the second surface 114 of the support substrate 110 may be partially removed to form openings 131 that expose the third metal wirings 122e of the connection wiring 122. A bump pad such as UBM may be formed on the third metal wirings 122e.

As illustrated in FIG. 13, the outer connectors 500 may be mounted on an outer surface of the sealing layer 130. The outer connectors 500 may be electrically connected to the connection wirings 122 through the openings 131, respectively. For example, the outer connectors 500 may include solder balls.

Then, a sawing process may be performed to form an individual hybrid stack substrate 100 to complete a fan-out panel level package including the semiconductor chip 300 mounted on the hybrid stack substrate 100.

Figure 14:
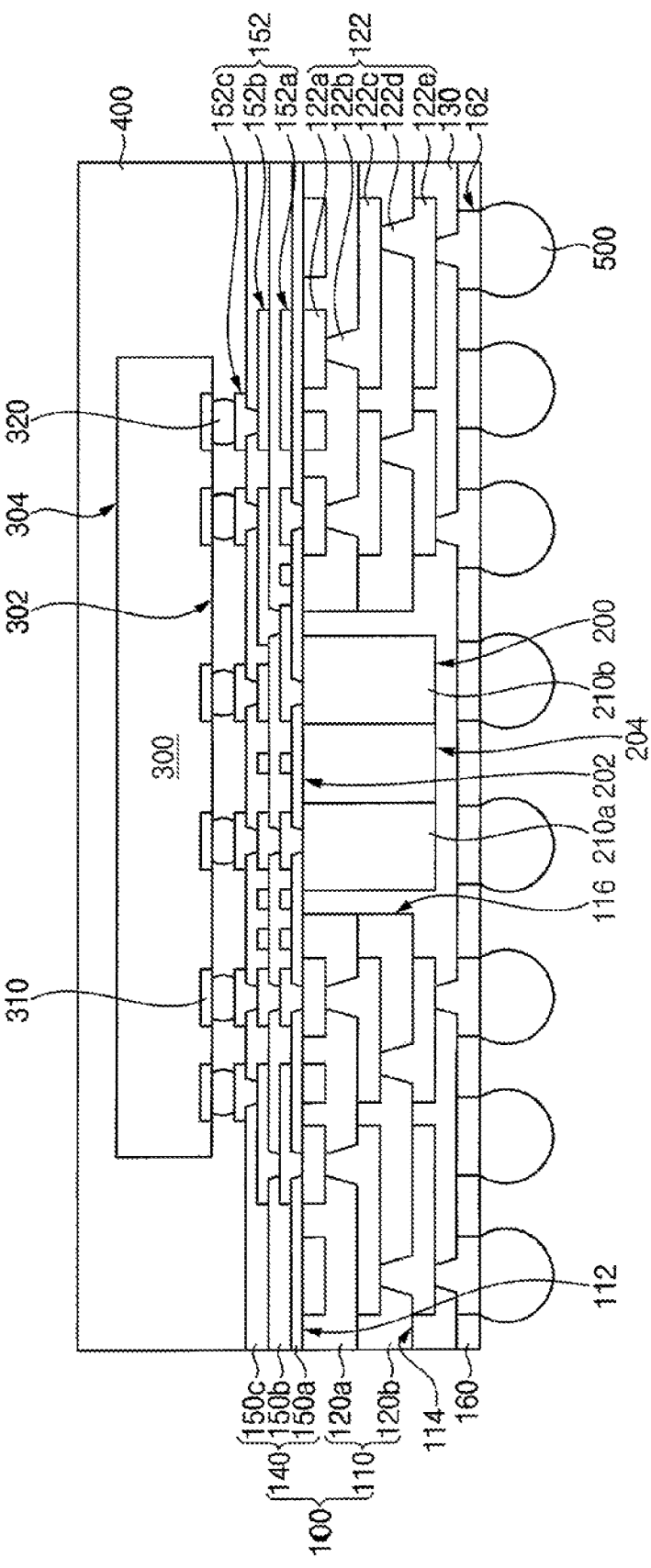
FIG. 14 is a cross-sectional view illustrating a semiconductor package in accordance with example embodiments of the present disclosure.

FIG. 14 is a cross-sectional view illustrating a semiconductor package in accordance with example embodiments of the present disclosure. The semiconductor package may be substantially the same as or similar to the semiconductor package described with reference to FIG. 1 except for an additional lower redistribution wiring layer. Thus, same reference numerals will be used to refer to the same or like elements and to the extent that a detailed description of an element has been omitted, it may be assumed that the element is at least similar to a corresponding element that has been described elsewhere in the specification.

Referring to FIG. 14, a hybrid stack substrate 100 of a semiconductor package 11 may further include a lower redistribution wiring layer disposed on a lower surface of a sealing layer 130. The lower redistribution wiring layer may include lower redistribution wirings 162 electrically connected to connection wirings 122 of a support substrate 110 respectively.

In example embodiments of the present disclosure, the lower redistribution wiring layer may include the lower redistribution wirings 162 electrically connected to third metal wirings 122e through openings formed in the sealing layer 130 respectively.

The lower redistribution wiring layer may include a protective pattern 160 disposed on the sealing layer 130 to expose at least portions of the lower redistribution wirings 162. In this case, a bump pad such as UBM may be formed on the portion of the lower redistribution wiring 162 exposed by the protective pattern. The portion of the lower redistribution wiring 162 on which the bump pad is formed may serve as a landing pad, e.g., package pad.

Outer connectors 500 may be disposed on the package pads on an outer surface of the lower redistribution layer. For example, the outer connector 500 may include a solder ball. The semiconductor package 1I may be mounted on a module substrate through the solder balls to form a memory module.

Accordingly, the solder balls may be freely disposed over the entire lower surface of the hybrid stack substrate 100, to thereby increase design freedom.

Hereinafter, a method of manufacturing the semiconductor package in FIG. 14 will be explained.

Figure 15:
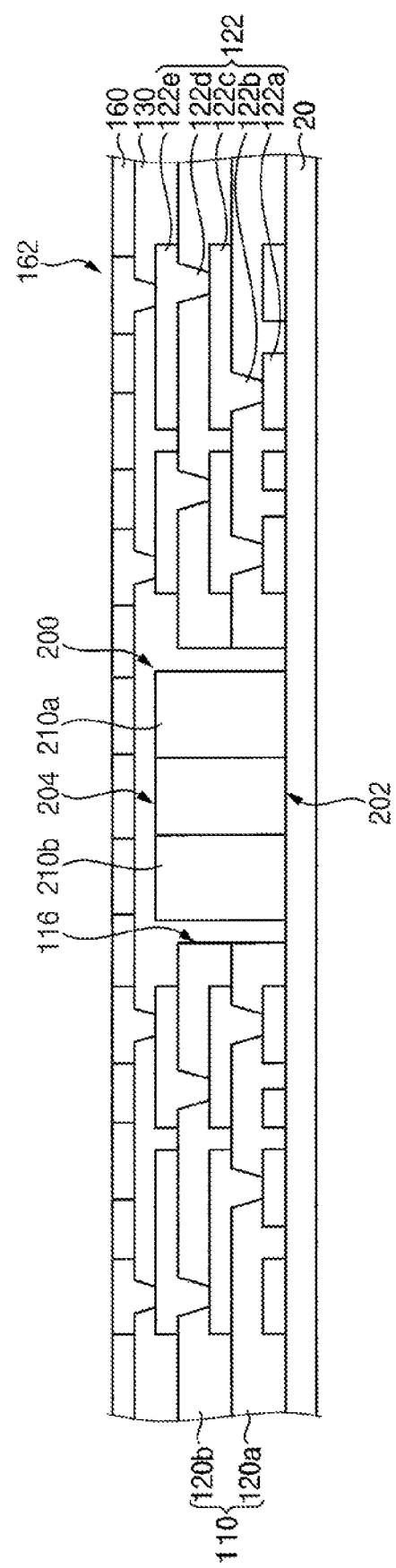
FIG. 15 is a cross-sectional view illustrating a method of manufacturing a semiconductor package in accordance with example embodiments of the present disclosure.

FIG. 15 is a cross-sectional view illustrating a method of manufacturing a semiconductor package in accordance with example embodiments of the present disclosure.

Referring to FIG. 15, first, processes the same as or similar to the processes described with reference to FIGS. 3 to 5 may be performed to form a sealing layer 130 covering a capacitor 200 disposed within a cavity 116 of a support substrate 110, and a lower redistribution wiring layer may be formed on the sealing layer 130. The lower redistribution wiring layer may include lower redistribution wirings 162 electrically connected to connection wirings of the support substrate 110.

In example embodiments of the present disclosure, the sealing layer 130 may be patterned to form openings that expose third metal wirings 122e of the connection wiring 122 respectively. Then, the lower redistribution wirings 162 may be formed on the sealing layer 130 to contact the third metal wirings 122e through the openings, respectively.

The lower redistribution wiring 162 may be formed by forming a seed layer on a portion of the sealing layer 130 and in the opening, patterning the seed layer and performing an electroplating process. Accordingly, the lower redistribution wiring 162 may be electrically connected to the second metal wiring 122b through the opening.

Then, a protective pattern 160 may be formed on the sealing layer 130 to expose at least portions of the lower redistribution wirings 162. In this case, a bump pad such as UBM may be formed on the portion of the lower redistribution wiring 162 exposed by the protective pattern by a following plating process. The portion of the lower redistribution wiring 162 on which the bump pad is formed may serve as a landing pad, e.g., package pad.

Then, processes the same as or similar to the processes described with reference to FIGS. 6 to 13 may be performed to form the semiconductor package in FIG. 14.

Figure 16:
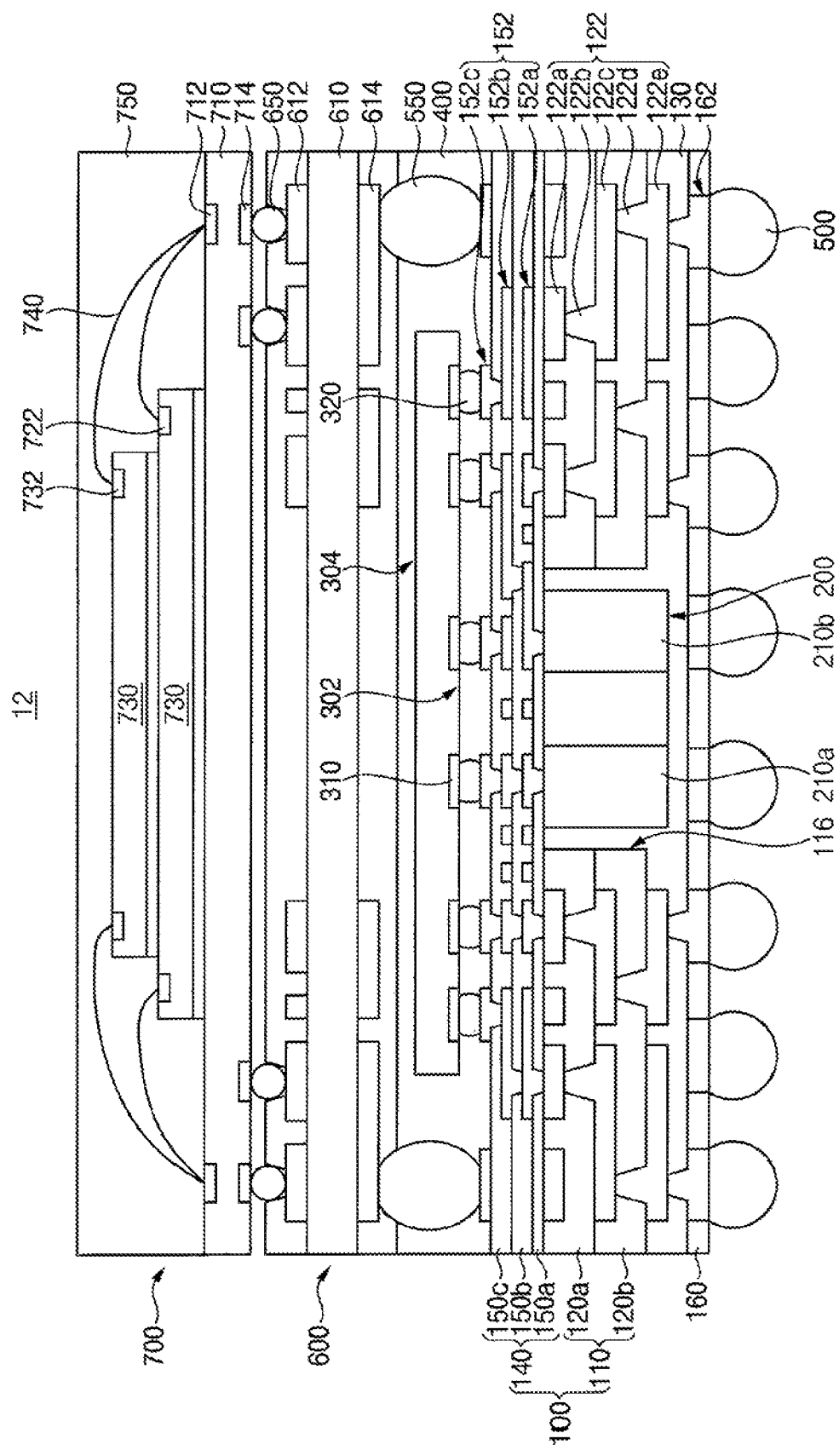
FIG. 16 is a cross-sectional view illustrating a semiconductor package in accordance with example embodiments of the present disclosure.

FIG. 16 is a cross-sectional view illustrating a semiconductor package in accordance with example embodiments of the present disclosure. The semiconductor package may be substantially the same as or similar to the semiconductor package described with reference to FIG. 14 except for an additional interposer and an additional second package. Thus, same reference numerals will be used to refer to the same or like elements and to the extent that a detailed description of an element has been omitted, it may be assumed that the element is at least similar to a corresponding element that has been described elsewhere in the specification.

Referring to FIG. 16, a semiconductor package 12 may include a first package, an interposer 600 stacked on the first package and a second package 700 stacked on the interposer 600. The first package may include a hybrid stack substrate 100, at least one semiconductor chip 300 mounted on the hybrid stack substrate 100, a molding 400 on the hybrid stack substrate 100 covering the semiconductor chip 300 and outer connectors 500 disposed on a lower surface of the hybrid stack substrate 100. The first package may be substantially the same as or similar to the unit package described with reference to FIG. 1.

In example embodiments of the present disclosure, the second package 700 may be stacked on the first package via the interposer 600.

The interposer 600 may be stacked on the first package via first conductive connectors 550. The interposer 600 may include an interposer substrate 610 and first and second connection pads 612 and 614 disposed on an upper surface and a lower surface of the interposer substrate 610. The first and second connection pads 612 and 614 may be electrically connected to each other by inner wirings of the interposer 600.

The first conductive connector 550 may penetrate at least a portion of the molding 400. An opening may be disposed in the molding 400 to expose a third redistribution wiring 152c of a redistribution wiring layer 140, and the first conductive connector 550 may be disposed in the opening and electrically connected to the third redistribution wiring 152c. The first conductive connectors 550 may protrude from an upper surface of the molding 400. The second connection pads 614 of the interposer 600 may contact the first conductive connectors 550 protruding from the upper surface of the molding 400 respectively. For example, the first conductive connector may include a conductive material such as a solder ball, a conductive pillar, etc.

In example embodiments of the present disclosure, the second package 700 may be stacked on the interposer 600 via second conductive connectors 650. For example, the second conductive connectors may include solder balls, conductive bumps, etc. The second conductive connectors 650 may be interposed between the first connection pad 612 of the interposer 600 and a second bonding pad 714 of a second package substrate 670. Accordingly, the first package and the second package 700 may be electrically connected to each other by the first conductive connectors 550, the interposer 600 and the second conductive connectors 650.

Second and third semiconductor chips 720 and 730 may be stacked on a second package substrate 710 by adhesive films. Bonding wires 740 may connect chip pads 722 and 732 of the second and third semiconductor chips 720 and 730 to first bonding pads 712 of the second package substrate 710. The second and third semiconductor chips 720 and 730 may be electrically connected to the second package substrate 710 by the bonding wires 740.

Although the second package 700 includes two semiconductor chips mounted by a wire bonding method, it will be understood that the number of semiconductor chips of the second package, a mounting method, etc. are not necessarily limited to two.

A heat sink may be disposed on the second package 700 to dissipate heat from the first and second packages to the environment. The heat sink may be attached on the second package 700 by a thermal interface material (TIM).

Hereinafter, a method of manufacturing the semiconductor package shown in FIG. 16 will be explained.

Figure 17:
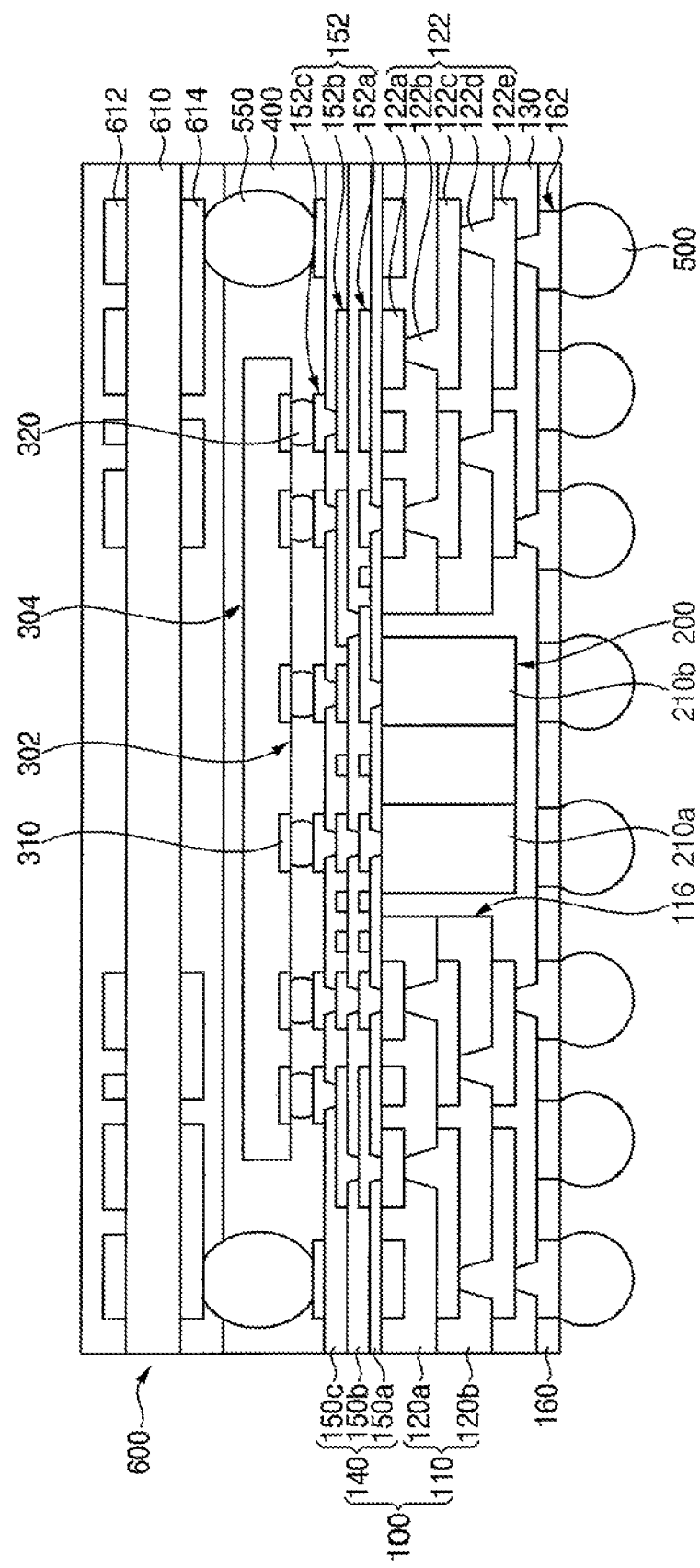
FIG. 17 is a cross-sectional view illustrating a method of manufacturing a semiconductor package in accordance with example embodiments of the present disclosure.

FIG. 17 is a cross-sectional view illustrating a method of manufacturing a semiconductor package in accordance with example embodiments of the present disclosure.

Referring to FIG. 17, first, processes the same as or similar to the processes described with reference to FIGS. 3 to 13 may be performed to form a first package, and an interposer 600 may be stacked on the first package to form a lower package (i-POP).

In example embodiments of the present disclosure, at least a portion of a molding 400 may be removed to form an opening that exposes a third redistribution wiring 152c of a redistribution wiring layer 140, and a first conductive connector 550 may be disposed in the opening. The first conductive connector 550 may be electrically connected to the third redistribution wiring 152c. The first conductive connectors 550 may protrude from an upper surface of the molding 400. For example, the first conductive connector may include a conductive material such as a solder ball, a conductive pillar, etc.

Then, the interposer 600 may be stacked on the molding 400 via the first conductive connectors 550. The interposer 600 may include an interposer substrate 610 and first and second connection pads 612 and 614 disposed on an upper surface and a lower surface of the interposer substrate 610. The second connection pads 614 of the interposer 600 may contact the first conductive connectors 550 protruding from the upper surface of the molding 400 respectively.

Then, a second package 700 may be stacked on the interposer 600 via second conductive connectors 650. For example, the second conductive connectors 650 may include solder balls, conductive bumps, etc. The second conductive connectors 650 may be interposed between the first connection pad 612 of the interposer 600 and a second bonding pad 714 of a second package substrate 670. Accordingly, the first package and the second package 700 may be electrically connected to each other by the first conductive connectors 550, the interposer 600 and the second conductive connectors 650.

Figure 18:
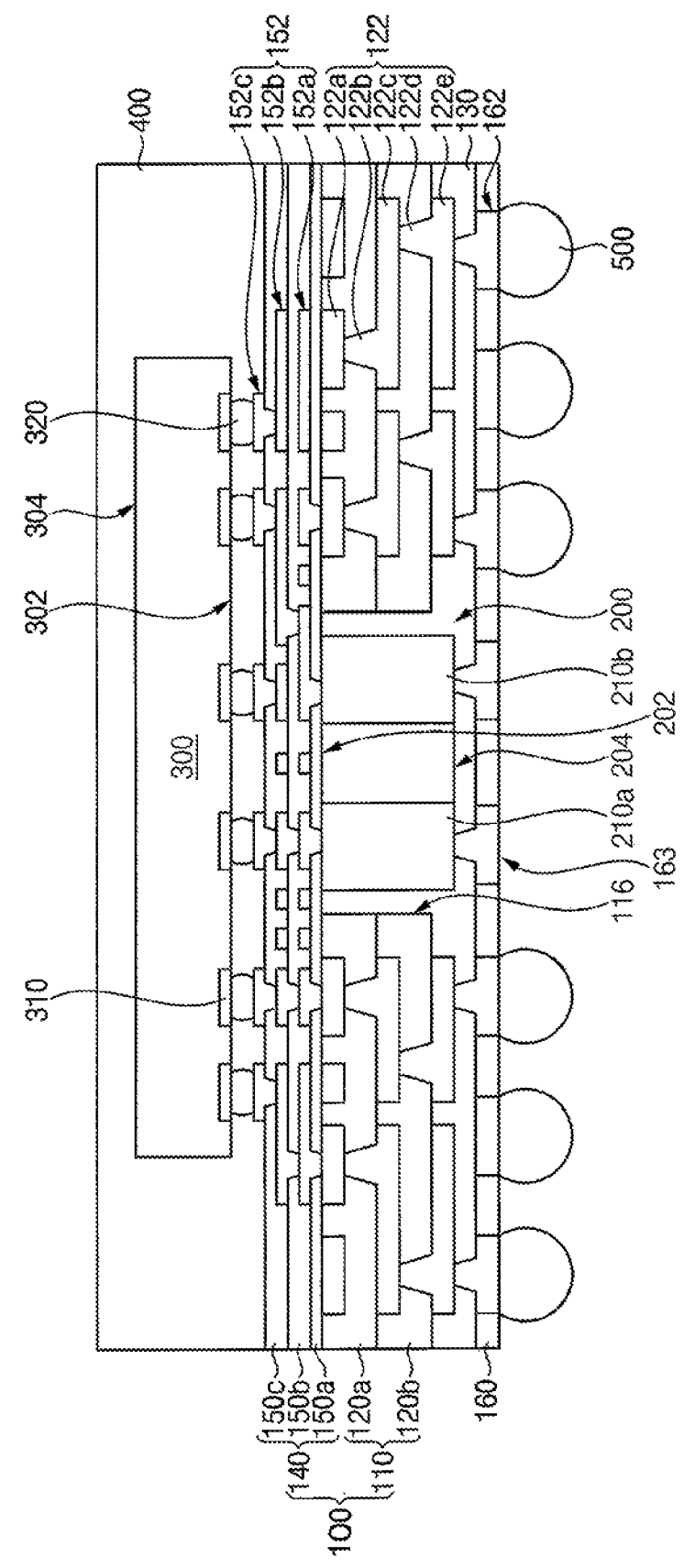
FIG. 18 is a cross-sectional view illustrating a semiconductor package in accordance with example embodiments of the present disclosure.

FIG. 18 is a cross-sectional view illustrating a semiconductor package in accordance with example embodiments of the present disclosure. The semiconductor package may be substantially the same as or similar to the semiconductor package described with reference to FIG. 14 except for electrical connections with electrodes of a capacitor. Thus, same reference numerals will be used to refer to the same or like elements and to the extent that a detailed description of an element has been omitted, it may be assumed that the element is at least similar to a corresponding element that has been described elsewhere in the specification.

Referring to FIG. 18, a hybrid stack substrate 100 of a semiconductor package 13 may further include a lower redistribution wiring layer disposed on a lower surface of a sealing layer 130. The lower redistribution wiring layer may include first lower redistribution wirings 162 electrically connected to connection wirings 122 of a support substrate 110 respectively. The lower redistribution wiring layer may include second lower redistribution wirings 163 electrically connected to first and second electrodes 210a and 210b of a capacitor 200 respectively.

In example embodiments of the present disclosure, the second lower redistribution wirings 163 may be electrically connected to the first and second electrodes 210a and 210b disposed on a lower surface 204 of the capacitor 200 through openings that formed in the sealing layer 130.

In example embodiments of the present disclosure, the openings may be formed in the sealing layer 130 to expose the first and second electrodes 210a and 210b disposed on the lower surface 204 of the capacitor 200, respectively. The second lower redistribution wirings 162 may be electrically connected to the first and second electrodes 210a and 210b disposed on the lower surface 204 of the capacitor 200 through the openings. The second lower redistribution wiring 163 may be electrically connected to a third metal wiring 122e of a support substrate 110.

Accordingly, the first and second electrodes 210a and 210b of the capacitor 200 may be electrically connected to connection wirings 122 of the support substrate 110 and redistribution wirings 152 of a redistribution wiring layer 140, respectively.

Figure 19:
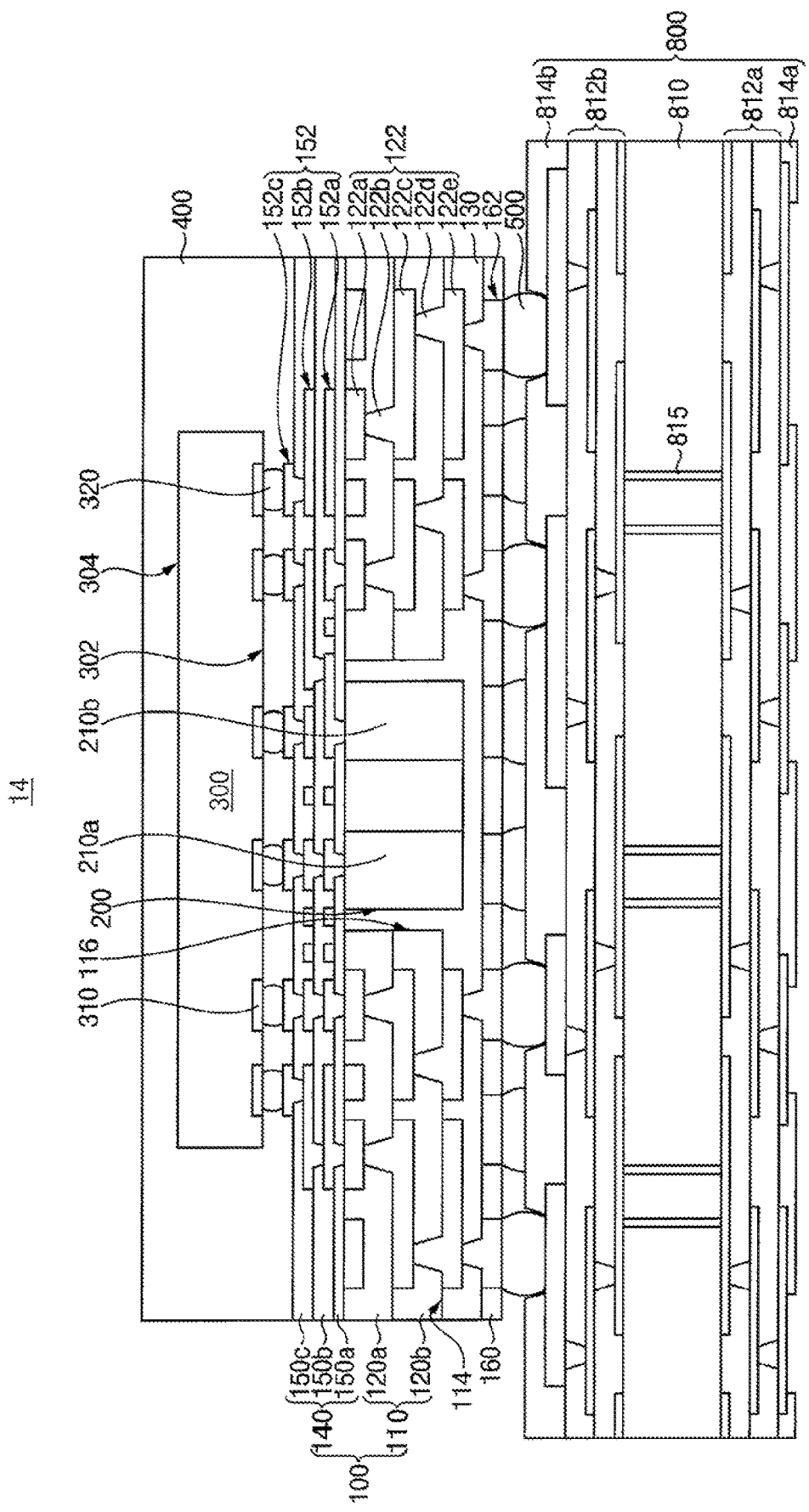
FIG. 19 is a cross-sectional view illustrating a semiconductor package in accordance with example embodiments of the present disclosure.

FIG. 19 is a cross-sectional view illustrating a semiconductor package in accordance with example embodiments of the present disclosure. The semiconductor package may be substantially the same as or similar to the semiconductor package described with reference to FIG. 14 except for an additional package substrate. Thus, same reference numerals will be used to refer to the same or like elements and to the extent that a detailed description of an element has been omitted, it may be assumed that the element is at least similar to a corresponding element that has been described elsewhere in the specification.

Referring to FIG. 19, a semiconductor package 14 may include a package substrate 800, a hybrid stack substrate 100 mounted on the package substrate 800, and a semiconductor chip 300 mounted on the hybrid stack substrate 100. The semiconductor package 14 may include a molding 400 disposed on the hybrid stack substrate 100 covering the semiconductor chip 300. The hybrid stack substrate may be substantially the same as or similar to the hybrid stack substrate described with reference to FIG. 14.

In example embodiments of the present disclosure, the semiconductor package 14 may be physically and/or electrically connected to a main board to be used as a chip-related component of an electronic device. The electronic device may be a network system. The semiconductor package 14 may be a BGA package as the chip-related component.

In order to buffer pitch differences between chip pads of the semiconductor chip 300 and mounding pads of the main board, the hybrid stack substrate 100 including the semiconductor chip 300 mounted thereon may be mounted and packaged on the package substrate 800, and finally, the package substrate 800 may be mounted on the main board to be provided as the chip-related component of the network system.

In example embodiments of the present disclosure, the hybrid stack substrate 100 may be mounted on the package substrate 800 via connectors 500.

For example, the package substrate 800 may include a core multilayer substrate such as a high-density printed circuit board (HDI PCB). The package substrate may include a core layer 810 and circuit layers 812a and 812b stacked on both upper and lower surfaces of the core layer 810. Protective layers 814a and 814b such as a solder resist layer may be formed on an outermost layer of the circuit layers. Each of the circuit layers may include a circuit pattern. Vias 815 may be formed in the core layer 810, and the circuit patterns in the circuit layers 812a and 812b may be electrically connected to each other by the via 815. It will be appreciated that the core multilayer substrate used as the package substrate is described by way of example, and the present invention is not necessarily limited thereto.

Accordingly, the circuit patterns of the package substrate 800 may be electrically connected to connection wirings 122 of the hybrid stack 100 by the connectors 500.

The semiconductor package 14 may be mounted on the main board via package connection terminals. The package connection terminals may include solder balls disposed on external connection terminals on a lower surface of the package substrate 800.

The semiconductor package may include semiconductor devices such as logic devices or memory devices. The semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like.

The foregoing is illustrative of example embodiments of the present disclosure. Although a few example embodiments have been described, those skilled in the art will readily appreciate that many modifications are possible in example embodiments without materially departing from the novel teachings and aspects of the present disclosure.

What is claimed is:

1. A semiconductor package, comprising:
a support substrate including a plurality of insulation layers and a plurality of connection wirings disposed in the plurality of insulation layers, the support substrate providing a cavity penetrating therethrough;
at least one capacitor disposed within the cavity of the support substrate, the at least one capacitor having first and second electrodes that are exposed from an upper surface of the support substrate and a dielectric disposed between the first and second electrodes;
a sealing layer at least partially filling the cavity and covering a lower surface of the support substrate;
a redistribution wiring layer covering the upper surface of the support substrate, the redistribution wiring layer having redistribution wirings electrically connected to the connection wirings and the first and second electrodes, respectively;
a semiconductor chip disposed on the redistribution wiring layer, the semiconductor chip having chip pads that are electrically connected to the redistribution wirings; and
outer connectors disposed on a lower surface of the sealing layer, and the outer connectors are electrically connected to the connection wirings through openings formed in the sealing layer respectively,
wherein upper surfaces of the first and second electrodes and the dielectric are coplanar with the upper surface of the support substrate and lower surfaces of the first electrode, the second electrode, and the dielectric are at a higher level than a lower surface of a lowest insulation layer of the support substrate, and
wherein the sealing layer covers the lower surfaces of the first electrode, the second electrode, and the dielectric.

2. The semiconductor package of claim 1, wherein an upper surface of the at least one capacitor is exposed from the upper surface of the support substrate.

3. The semiconductor package of claim 1, further comprising:
a lower redistribution wiring layer disposed on a lower surface of the sealing layer, the lower redistribution wiring layer including lower redistribution wirings electrically connected to the connection wirings.

4. The semiconductor package of claim 3, wherein the outer connectors are disposed on the lower redistribution wiring layer, and the outer connectors are electrically connected to the lower redistribution wirings of the lower redistribution wiring layer, respectively.

5. The semiconductor package of claim 1, wherein a thickness of the at least one capacitor is greater than or equal to a thickness of the support substrate.

6. The semiconductor package of claim 1, further comprising:
a molding disposed on the redistribution wiring layer and covering the semiconductor chip.

7. The semiconductor package of claim 6, further comprising:
a plurality of conductive connectors penetrating through at least a portion of the molding, the conductive connectors being electrically connected to the redistribution wirings of the redistribution wiring layer, respectively.

8. A semiconductor package, comprising:
a support substrate including a plurality of insulation layers and a plurality of connection wirings disposed in the plurality of insulation layers, the support substrate providing a cavity penetrating therethrough;
at least one capacitor disposed within the cavity of the support substrate, the at least one capacitor having first and second electrodes that are exposed from an upper surface of the support substrate and a dielectric disposed between the first and second electrodes;
a sealing layer at least partially filling the cavity and covering a lower surface of the support substrate;
a redistribution wiring layer covering the upper surface of the support substrate, the redistribution wiring layer having redistribution wirings electrically connected to the support substrate and the first and second electrodes respectively;
a semiconductor chip disposed on the redistribution wiring layer, the semiconductor chip having chip pads that are electrically connected to the redistribution wirings respectively; and
outer connectors disposed on a lower surface of the sealing layer and electrically connected to the support substrate,
wherein upper surfaces of the first and second electrodes and the dielectric are coplanar with the upper surface of the support substrate and lower surfaces of the first electrode, second electrode, and the dielectric are at a higher level than a lower surface of a lowest insulation layer of the support substrate, and
wherein the sealing layer covers the lower surfaces of the first electrode, second electrode and the dielectric.

9. The semiconductor package of claim 8, wherein an upper surface of the at least one capacitor is exposed from the upper surface of the support substrate.

10. The semiconductor package of claim 8, wherein the semiconductor chip is mounted on the redistribution wiring layer via conductive bumps interposed between the chip pads and the redistribution wirings.

11. The semiconductor package of claim 8, wherein a thickness of the at least one capacitor is a range of from 50 μm to 250 μm.

12. The semiconductor package of claim 8, wherein the outer connectors are electrically connected to the support substrate through openings formed in the sealing layer respectively.

13. The semiconductor package of claim 8, further comprising:
a lower redistribution wiring layer disposed on a lower surface of the sealing layer, the lower redistribution wiring layer having lower redistribution wirings electrically connected to the support substrate.

14. The semiconductor package of claim 13, wherein the outer connectors are disposed on the lower redistribution wiring layer, and the outer connectors are electrically connected to the lower redistribution wirings of the lower redistribution wiring layer respectively.

15. The semiconductor package of claim 8, further comprising:
   a plurality of conductive connectors electrically connected to the redistribution wirings of the redistribution wiring layer respectively; and
   an interposer disposed on the sealing layer via the conductive connectors.

16. A semiconductor package, comprising:
   a hybrid stack substrate including a support substrate including a plurality of insulation layers a plurality of connection wirings disposed in the plurality of insulation layers and a cavity penetrating through the support substrate, at least one capacitor in the cavity of the support substrate and including first and second electrodes that are exposed from an upper surface of the support substrate and a dielectric disposed between the first and second electrodes, a sealing layer at least partially filling the cavity and covering a lower surface of the support substrate, and a redistribution wiring layer covering the upper surface of the support substrate and having redistribution wirings electrically connected to the connection wirings and the first and second electrodes respectively;
   a semiconductor chip disposed on the hybrid stack substrate, the semiconductor chip having chip pads that are electrically connected to the redistribution wirings; and
   outer connectors disposed on a lower surface of the hybrid stack substrate and electrically connected to the connection wirings,
   wherein upper surfaces of the first and second electrodes and the dielectric are coplanar with the upper surface of the support substrate and lower surfaces of the first electrode, second electrode, and the dielectric are at a higher level than a lower surface of a lowest insulation layer of the support substrate, and
   wherein the sealing layer covers the lower surfaces of the first electrode, second electrode and the dielectric.

* * * * *